United States Patent [19]

Henderson et al.

[11] Patent Number: 5,191,216

[45] Date of Patent: Mar. 2, 1993

[54] QUANTUM MECHANICAL SEMICONDUCTOR DEVICE WITH ELECTRON/HOLE DIFFRACTIVE GRATING

[75] Inventors: Gregory N. Henderson; Thomas K. Gaylord; Elias N. Glytsis, all of Atlanta, Ga.

[73] Assignee: Georgia Tech Research Corporation, Atlanta, Ga.

[21] Appl. No.: 734,300

[22] Filed: Jul. 18, 1991

[51] Int. Cl.$^5$ ............................................. H01L 29/80
[52] U.S. Cl. ......................................... 257/28; 257/26; 257/29; 250/396 R
[58] Field of Search ................. 250/396 R, 505.1; 357/22, 15

[56] References Cited

U.S. PATENT DOCUMENTS 4,962,410  10/1990  Kriman et al. ..................... 357/15
5,051,791   9/1991  Baldwin et al. .................. 357/22 A Primary Examiner—Jack I. Berman
Assistant Examiner—Kiet T. Nguyen
Attorney, Agent, or Firm—Hurt, Richardson, Garner, Todd & Cadenhead

[57] ABSTRACT

A solid state, quantum mechanical electron/hole wave device in the form of a switch or multiplexor includes a layer of semiconductor material supporting substantially ballistic electron/hole transport and a periodic grating structure formed in the layer of semiconductor material, with the grating structure comprising a modulation in electron/hole potential energy and/or effective mass. Preferably, means are provided for applying and varying the grating modulation. By constructing the device to divide the input substantially completely into two output beams (to operate in the Bragg regime), a useful switch is provided. Likewise, by constructing the device to divide the input into a selected number of three or more output beams (to operate in the Raman-Nath regime), a useful multiplexor is provided.

58 Claims, 11 Drawing Sheets

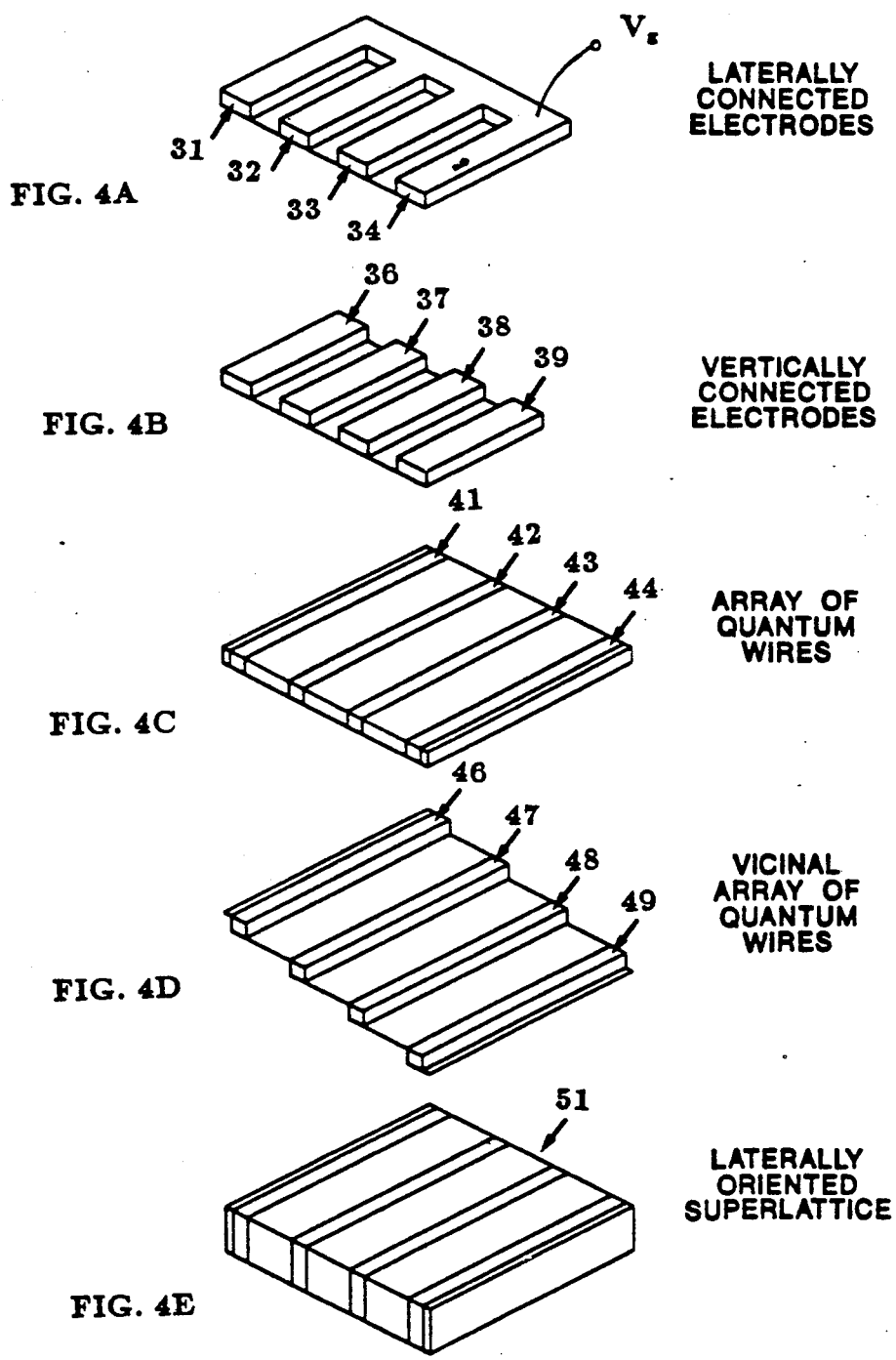

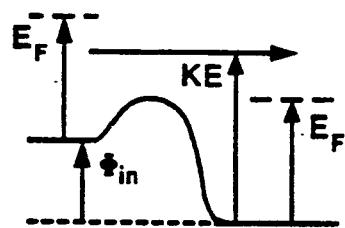
FIG. A
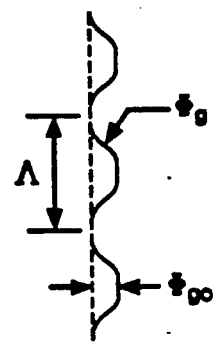
FIG. 8B
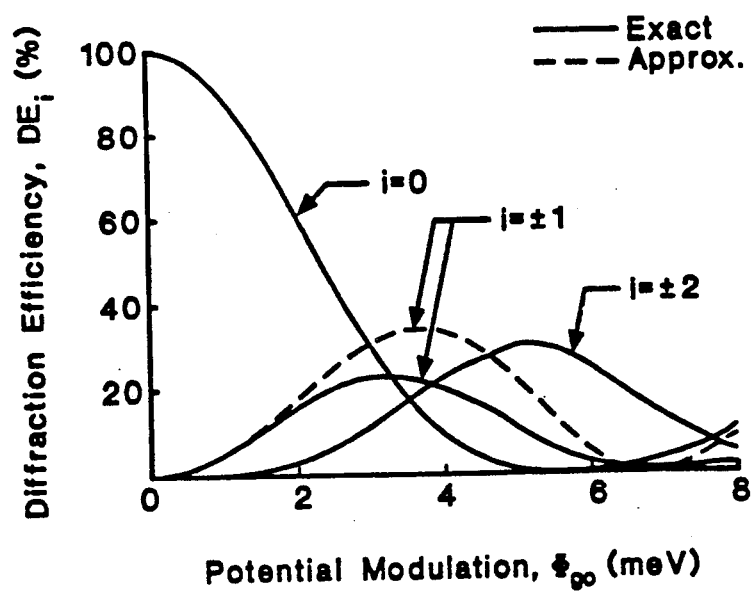
FIG. 8C

5,191,216

QUANTUM MECHANICAL SEMICONDUCTOR DEVICE WITH ELECTRON/HOLE DIFFRACTIVE GRATING

This invention was made with government support under Contract No. DAAL03-90-C-004 awarded by the U.S. Army Research Office and by Grant No. ECS-8909971 granted by the National Science Foundation. The government has certain rights in this invention.

TECHNICAL FIELD

The present invention relates generally to quantum mechanical semiconductor devices, and more particularly relates to quantum mechanical semiconductor switches, multiplexors, interconnects, etc., with an electron/hole diffractive grating.

BACKGROUND OF THE INVENTION

Semiconductor devices, such as transistors, microprocessors, etc., have been designed and fabricated in ever smaller and smaller sizes. However, such miniaturization has in recent years encountered a fundamental size limitation. As devices are constructed with dimensions of less than about $\frac{1}{4}$ of a micron, "troublesome" quantum wave effects begin to dominate the characteristics of the device. For example, electron charge flow in nanometer-size wires is greatly affected by a bend in the wire. Another example of these observed effects is electron wave "self-interference".

Semiconductor growth and fabrication techniques, such as molecular beam epitaxy, metalorganic chemical vapor deposition, and nanolithography, have been refined to the point that semiconductor structures can be fabricated with device dimensions on the order of electron wavelengths. Using these techniques, devices exhibiting ballistic (i.e., collisionless) electron transport have been fabricated. Starting from fundamental principles, it has been shown that these ballistic electrons are quantum-mechanical deBroglie waves and can be reflected, refracted, diffracted, guided, and interfered in a manner analogous to plane waves in dielectric materials. This has led to a new class of ultra-small, ultra-fast devices such as those shown in U.S. Pat. Nos. 4,985,737 of Gaylord, et al., 4,987,458 of Gaylord, et al., and 4,970,563 of Gaylord, et al.

Technical papers published in 1988 and 1989 discuss a ballistic electron transistor device based on diffraction of an electron wave from a 50% duty-cycle potential energy grating formed by a superlattice. See, K. Furuya, "Novel High-Speed Transistor Using Electron Wave Diffraction," J. Appl. Phys., Vol. 62, pp. 1492-1494, Apr. 21, 1989; K. Furuya and K. Kurishima, "Theoretical Properties of Electron Wave Diffraction Due to a Transversally Periodic Structure in Semiconductors," IEEE J. Quantum Elect., Vol. 24, pp. 1652-1658, August 1988; and K. Kurishima, K. Furuya and S. Samadi, "Theoretical Study of Electron Wave Diffraction Caused by Transverse Potential Grating——Effect of Incident Angle," IEEE J. Quantum Elect., Vol. 25, pp. 2350-2356, November 1989. The analysis presented in these papers is limited to the 50% duty-cycle with no variation in effective mass. Also, these papers do not present an approach that can be employed to construct a grating profile which would be designed to produce an arbitrary desired result. Importantly, the device discussed in these papers diffracts the input electron beam into a large number (not preselected) of output beams, making the device impractical as a switch or multiplexor. Furthermore, these papers and the existing state of the art known to the applicants do not disclose a quantum mechanical electron/hole device in the form of a switch or multiplexor.

Accordingly, it can be seen that a need yet remains for quantum mechanical semiconductor devices with electron/hole diffractive gratings which can be useful as switches, multiplexors, etc. It is for the provision of such that the present invention is primarily directed.

SUMMARY OF THE INVENTION

Briefly described, in a preferred form the present invention comprises a solid state, quantum mechanical electron/hole wave device in the form of a switch or multiplexor and includes a layer of semiconductor material supporting substantially ballistic electron/hole transport and a periodic grating structure formed in the layer of semiconductor material, with the grating structure comprising a modulation in electron/hole potential energy and/or effective mass. Preferably, means are provided for applying and varying the grating modulation.

In another preferred form, the invention comprises a solid state, quantum mechanical electron/hole wave device including a layer of semiconductor material which supports substantially ballistic electron/hole transport at energies above the conduction band and a grating structure formed in the layer of semiconductor material comprised of a modulation in electron/hole potential energy and/or effective mass for diffracting substantially all of the input electron/hole beam energy into two output electron/hole beams. This is accomplished by constructing the device to have physical parameters, such as angle of input beam incidence, grating period, grating slant angle, etc., which are selected to cause the device to operate in the "Bragg regime", whereby the diffraction is restricted to substantially only two output beams.

In another preferred form, the invention comprises a solid state, quantum mechanical electron/hole wave device including a layer of semiconductor material which supports substantially ballistic electron/hole transport at energies above the conduction band and a grating structure formed in the layer of semiconductor material comprised of a modulation in electron/hole potential energy and/or effective mass for diffracting substantially all of the input electron/hole beam energy into three or more output electron/hole beams. This is accomplished by constructing the device to have physical parameters, such as angle of input beam incidence, grating period, grating slant angle, etc., which are selected to cause the device to operate in the "Raman-Nath regime", whereby the diffraction is restricted to a selected number of three or more output beams.

By constructing the device to divide the input substantially completely into two output beams (to operate in the Bragg regime), a useful switch is provided. Likewise, by constructing the device to divide the input into a selected number of three or more output beams (to operate in the Raman-Nath regime), a useful multiplexor is provided. Devices according to the present invention promise to prove smaller, faster, and more efficient than any currently available semiconductor devices.

Accordingly, it is a primary object of the present invention to provide switching devices, such as switches, multiplexors, etc., which are capable of high switching speeds.

It is another object of the present invention to provide switching devices, such as switches, multiplexors, etc., which are of extremely small dimension.

It is another object of the present invention to provide switching devices, such as switches, multiplexors, etc., which are efficient in operation.

Other objects, features, and advantages of the present invention will become apparent upon reading the following specification in conjunction with the accompanying drawing figures.

BRIEF DESCRIPTION OF THE DRAWING FIGURES

FIGS. 4A-4E are schematic perspective illustrations of diffractive grating structures for use in the quantum mechanical semiconductor devices of FIGS. 1 and 2.

FIG. 8A is a schematic illustration of the conduction band profile (potential energy profile) as a function of distance (in the direction of propogation) of an electron injection portion of the device of FIG. 2.

FIGS. 8B is a schematic illustration of the conduction band profile of the diffraction grating of FIG. 1 operating in the Raman-Nath regime as a function of gate voltage and lateral dimension.

FIG. 8C is a schematic illustration of analytical performance results of the diffractive grating portion of the device of FIG. 2 operating in the Raman-Nath regime, depicting diffraction efficiency as a function of potential modulation.

DETAILED DESCRIPTION

Figure 1:
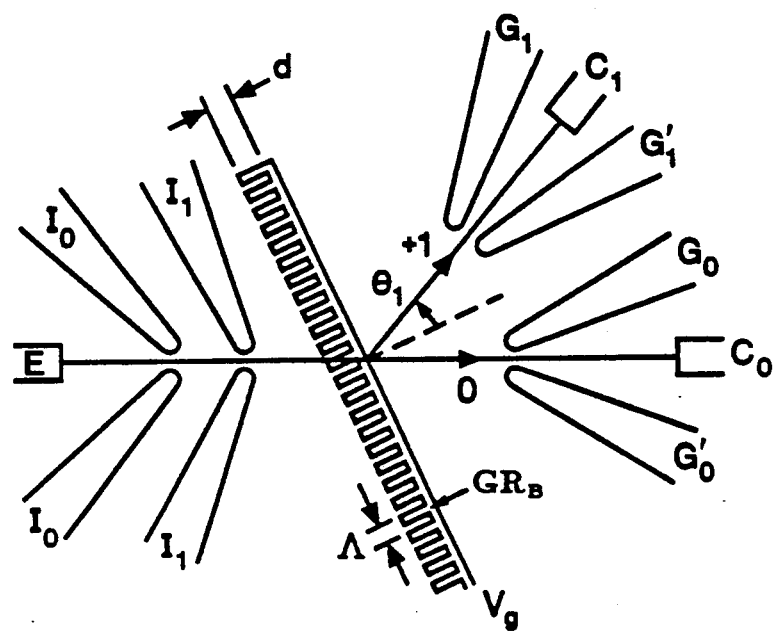
FIG. 1 is a schematic illustration of a quantum mechanical semiconductor device with an electron/hole diffractive grating operating in the Bragg regime according to a preferred form of the invention.
Figure 2:
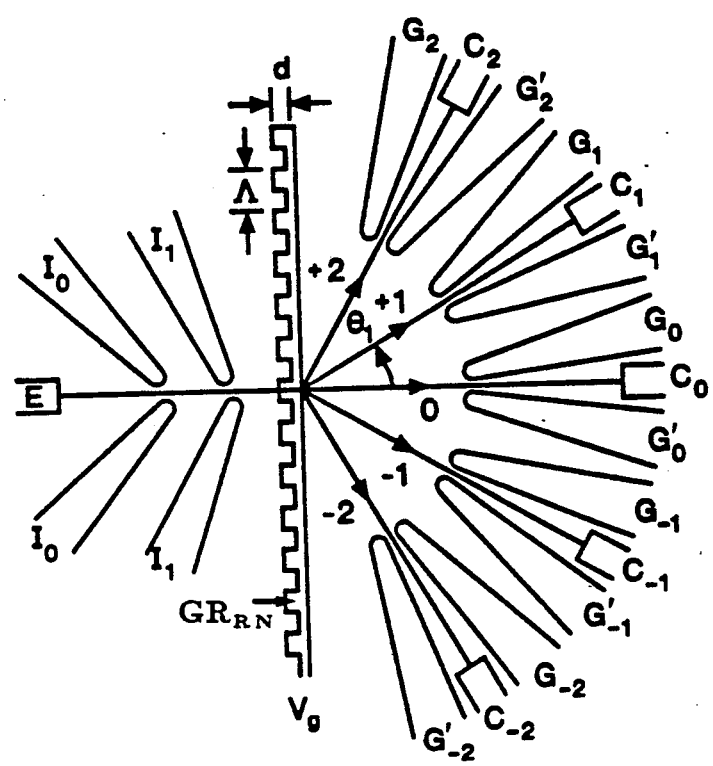
FIG. 2 is a schematic illustration of a quantum mechanical semiconductor device with an electron/hole diffractive grating operating in the Raman-Nath regime according to a second preferred form of the invention.

Referring now in detail to the drawing figures, illustrative forms of switching devices according the present invention are considered. Switching devices, as that term is used herein, encompasses switches, multiplexors, and multiple-pole interconnects. The term electron/hole as that term is used herein to describe a device, relates to a device that can operate with a working medium of electrons, or holes, or both. FIG. 1 shows a quantum mechanical semiconductor switch with an electron/hole diffractive grating. FIG. 2 shows a quantum mechanical semiconductor multiplexor with an electron/hole diffractive grating. The switch of FIG. 1 and the multiplexor of FIG. 2 were developed as a result of a rigorous analysis, the results of that analysis are presented below to better illustrate the principles of the present invention. Accordingly, the details of the switch and multiplexor are discussed in more detail thereafter.

Figure 3:
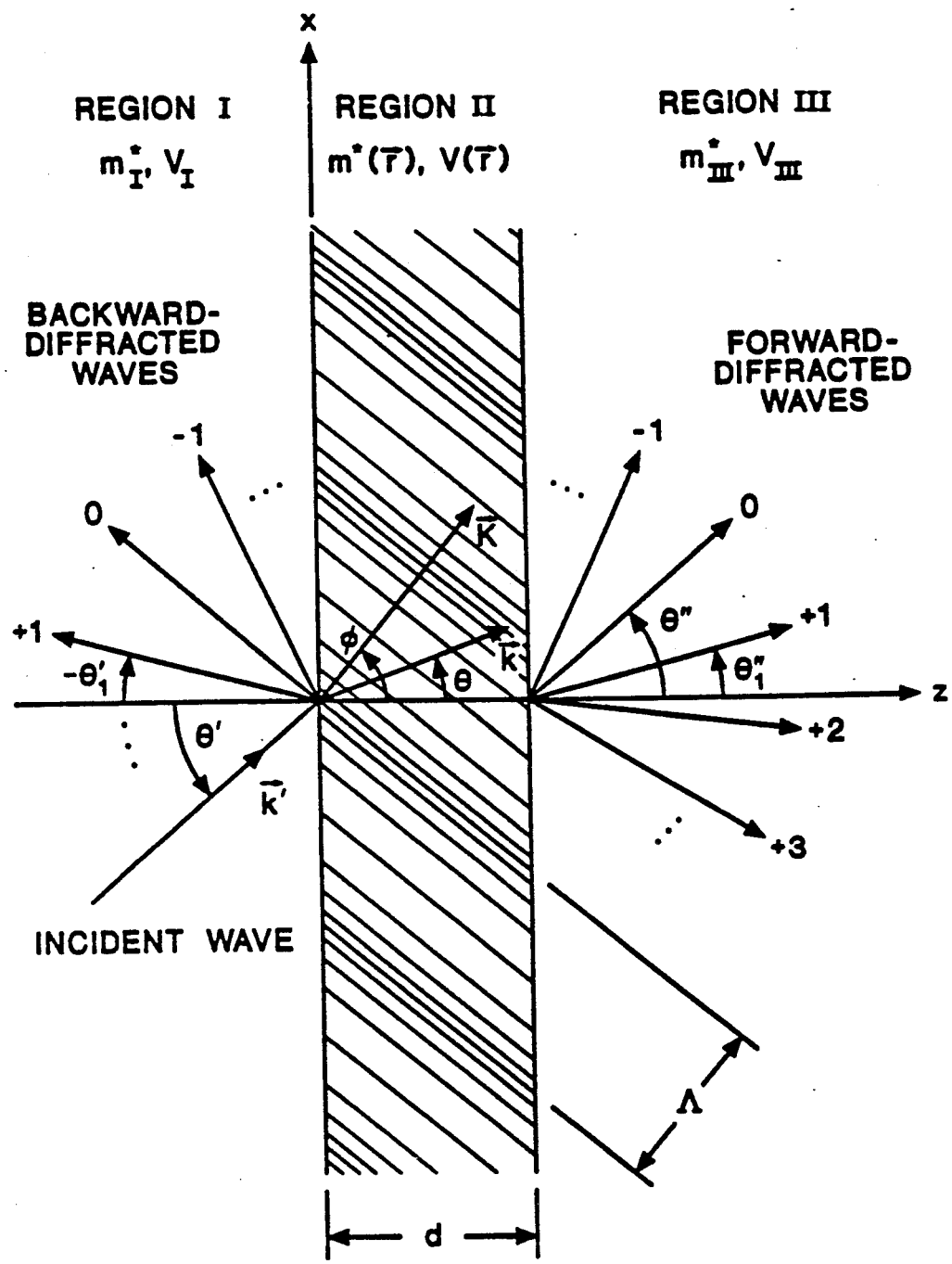
FIG. 3 is a schematic illustration of an electron/hole diffractive grating portion of the devices of FIGS. 1 and 2.

An electron wave diffraction grating used in this invention is shown as Region II in FIG. 3, with grating vector $\vec{K}$, period $\pi$ ($|\vec{K}|=2\pi/\Lambda$), slant angle $\phi$, and thickness d. The input and output regions, Regions I and III respectively, are described by effective masses $m_I^*$ and $m_{III}^*$ and potential energies $V_I$ and $V_{III}$ respectively. An electron wave of energy E and wavevector $\vec{k}'$ is incident from the input region at an angle $\theta'$ and is diffracted into forward- and backward-diffracted orders in regions III and I respectively. The Hamiltonian used for the electron wave inside the grating is given as, $$\frac{-\hbar^2}{2} \vec{\nabla} \cdot \left( \frac{\vec{\nabla}\psi}{m^*(r)} \right) = [E - V(r)]\psi, \tag{1}$$

where $\psi$ is the electron wave amplitude, h is Planck's constant divided by $2\pi$, and m* and V are the periodic effective mass and potential energy in the grating (periodic with grating vector $\vec{K}$). The Floquet theorem (Bloch theorem) for waves in a periodic medium states that the electron wave inside the grating can be described as $\psi = \Sigma_{i=-\infty}^{\infty} U_i(z)\exp(-j\vec{\sigma}_i \cdot \vec{r})$ where $\vec{\sigma}_i = \vec{k} - i\vec{K}$, $\vec{k}$ is the incident wavevector refracted into the grating, i is the integer diffracted order, and $j=(-1)^{\frac{1}{2}}$. Likewise, the electron wave in the input region is given as $\psi = \exp(j\vec{k}' \cdot \vec{r}) + \Sigma_i = -\infty$ $R_i\exp(j\vec{k}_i \cdot \vec{r})$ where $\vec{k}_i'$ and $R_i$ are the wavevector and amplitude of the ith backward-diffracted order respectively. The electron wave in the output region is $\psi = \Sigma_i = -\infty$ $T_i\exp(j\vec{k}_i'' \cdot \vec{r})$ where $\vec{k}_i''$ and $T_i$ are the wavevector and amplitude of the ith forward-diffracted order respectively.

By employing phase matching of the input and output waves to the space-harmonics in the grating region $(U_i(z))$, one finds the grating equations to be $$[2m_I^*(E-V_I)]^{\frac{1}{2}}\sin\theta' - (2\pi i\hbar/\Lambda)$$
$$\sin\phi = r_n[2m_n^*(E-V_n)]^{\frac{1}{2}}\sin\theta_i^n, \tag{2}$$

where n=I, III, $r_I=-1$, $r_{III}=1$, and $\theta_i^I=\theta_i'$ and $\theta_i^{III}=\theta_i''$ are the angles (measured positive counterclockwise from the grating surface normal) of propagation of the ith backward- and forward-diffracted orders respectively. Those space-harmonics that cannot phase match to propagating orders are evanescent ($\vec{k}_i$ and $\theta_i$ are imaginary) or "cutoff" orders. The grating equations of this invention present a simple method for calculating the directions of the diffracted orders and the identification of the evanescent orders. The directions of the propagating diffracted orders are shown schematically in FIG. 3.

To calculate the amplitudes of the diffracted waves, a Rigorous Coupled Wave Analysis (RCWA) was developed, similar to the method employed in electromagnetics. In electromagnetics, the RCWA is a well known and well established method for analyzing electromagnetic diffraction by an arbitrary profile permittivity grating. See, for example, M. G. Moharam and T. K. Gaylord, "Rigorous coupled wave analysis of planar-grating diffraction," *Journal of the Optical Society of America*, vol. 71, pp. 811–818, July 1981. In this application, the RCWA is modified to model electron wave diffraction by an arbitrary profile effective mass and/or potential energy grating. In this regard, the effective mass and potential energy in the grating region are expanded as Fourier series in $\vec{K}$ and substituted into Eq. (1). In order to allow for discontinuities in the effective mass (as in a $Ga_{1-x}Al_xAs$ superlattice), Eq. (1) is separated into two first-order vector equations where the derivatives of the effective mass have been eliminated. These first-order equations are solved using the state-variable approach from linear-systems theory where the infinite sums for the wave amplitudes are truncated to a finite number of orders. The number of orders is chosen to ensure convergence of the diffraction efficiencies. Through the application of the boundary conditions (continuity of $\psi$ and $\vec{\nabla}\psi\cdot\hat{z}/m^*$), the $R_i$'s and $T_i$'s are calculated.

In electromagnetics, the diffraction efficiency is defined as the ratio of the z-component of the power carried by the ith diffracted order to the z-component of the power in the incident wave. In an analogous manner, the diffraction efficiency for electron wave gratings is defined as the ratio of the z-component of the probability current carried by the ith diffracted order to the z-component of the probability current of the incident wave. Using the definition of probability current $\vec{J}=j\hbar(\psi\vec{\nabla}\psi^* - \psi^*\vec{\nabla}\psi)/2m^*$, one finds the diffraction efficiencies in regions I and III to be $DE_i^I = (\cos\theta_i'/\cos\theta')|R_i|^2$ and $DE_i^{III} = (\sqrt{m_I^*(E-V_{III})}\cos\theta_i''|\sqrt{m_{III}^*(E-V_I)}\cos\theta')|T_i|^2$ respectively.

The RCWA presented in this application is a robust procedure that can be applied to arbitrary grating profiles. To design electron wave grating devices, however, it is useful to have analytical expressions that describe the diffraction efficiencies in terms of the grating parameters. In electromagnetics, the Bragg regime and the Raman-Nath regime are often used for grating design. The criteria and characteristics of these regimes in the context of electromagnetics are discussed in M. G. Moharam, T. K. Gaylord, and R. Magnusson "Criteria for Bragg regime diffraction by phase gratings," *Optics Communications*, vol. 32, pp. 14–18, January 1980 and M. G. Moharam, T. K. Gaylord, and R. Magnusson "Criteria for Raman-Nath regime diffraction by phase gratings," *Optics Communications*, vol. 32, pp. 19–23, January 1980. An important and fundamental part of this invention is the recognition that such regimes are applicable in an analogous way to the diffraction of ballistic electrons/holes by semiconductor gratings. In the Bragg regime, the grating parameters can be adjusted such that substantially all of the input current can be diffracted into two output beams. In other words, in the Bragg regime, the diffraction efficiency of the $i=0$ and $i=i_a$ diffracted orders (where $i_a$ is a positive or negative integer corresponding to the order that satisfies the Bragg condition discussed below) add up to substantially all of the input current. In the Raman-Nath regime, the grating parameters can be adjusted such that substantially all of the input current can be divided among three or more orders. In order for a grating to be in the Bragg regime, the angle of incidence is adjusted so that the $i_a$th diffracted wavevector inside the grating ($\vec{\sigma}_{i_a}$) lies on the allowed wavevector surface inside the grating, yielding $$\sqrt{2m^*_{II}(E-V_{II})} = \pi i_a \hbar/\Lambda \cos(\theta - \phi), \quad (3)$$

where $m_{II}$ and $V_{II}$ are the average effective mass and average potential energy inside the grating, and $\theta$ is the refracted wavevector angle inside the grating. When an electron wave is incident at the Bragg condition (i.e. it satisfies Eq. (3)), the diffraction is said to be in the Bragg regime if the grating thickness parameter $Q'$ and the grating strength parameter $\gamma$ satisfy the relation $\rho_B = Q'/2\gamma > 1$, where $\rho_B$ is the Bragg regime parameter. If these conditions are satisfied, the sum of the diffraction efficiencies in all diffracted orders other than $i=0$ and $i=i_a$ is less than $1/\rho_B^2$. Therefore, it is usually preferable to have $\rho_B \gg 1$. The symbol $Q'$ is the effective thickness of the grating given by $Q' = 4\pi^2 hd/\sqrt{2m_{II}^*(E-V_{II})}\Lambda^2 \cos\theta$. The symbol $\gamma$ is the coefficient that couples the power between the $i=0$ and the $i=i_a$ order when only two waves are included in the coupled-wave analysis. For a sinusoidal effective mass variation $\gamma = [m_{II}^*(E-V_1) + m_1^*(E-V_{II})\cos(2\theta)]d/\sqrt{2m_{II}^*(E-V_{II})}\hbar\cos\theta$, where $m_1^*$ and $V_1$ are the amplitudes of the sinusoidal effective mass and potential energy variations.

Figure 5A:
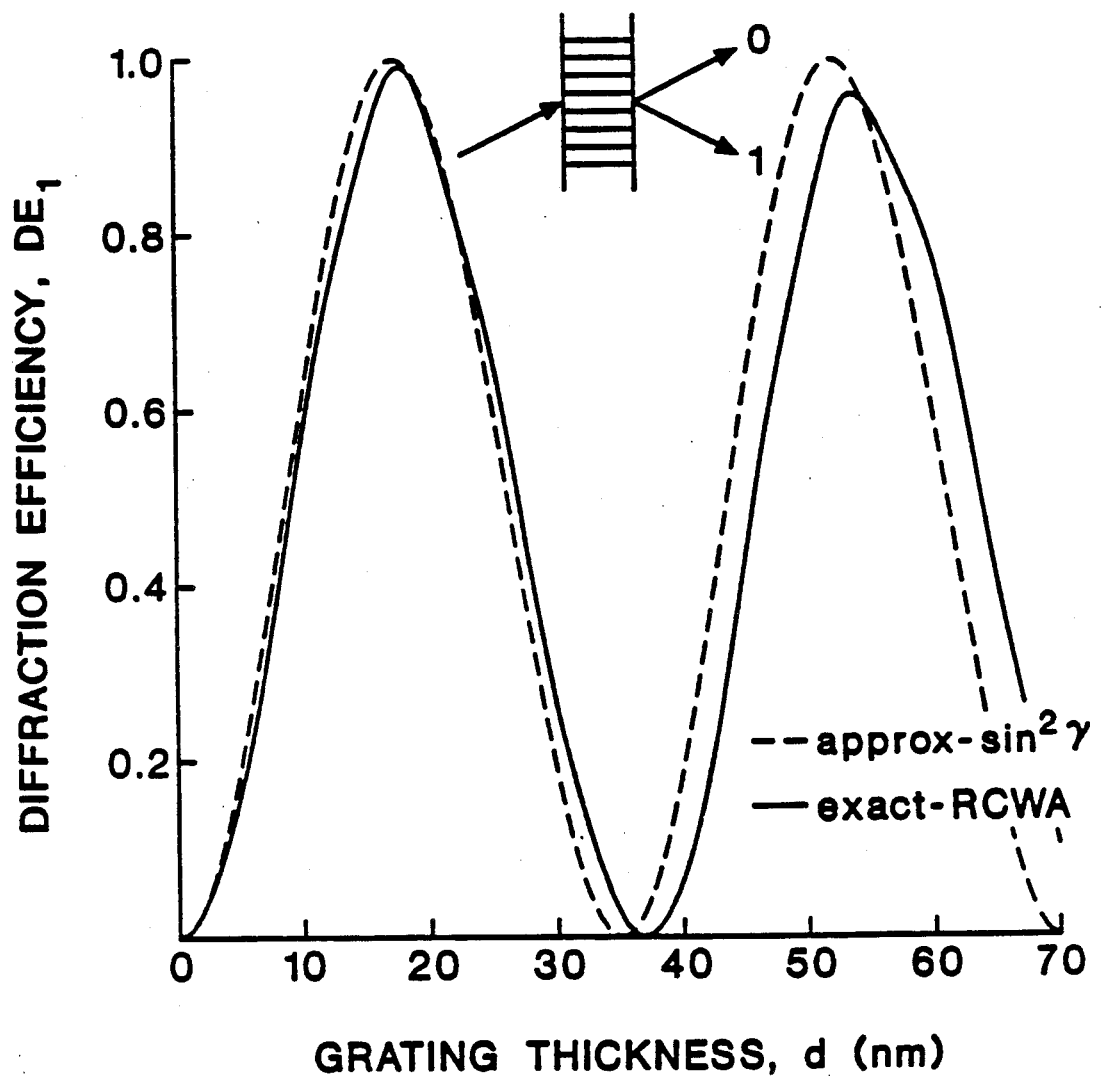
FIG. 5A is a schematic illustration of analytical performance results of the diffractive grating of FIG. 3 operating in the Bragg regime, depicting diffraction efficiency as a function of grating thickness.

The diffraction efficiency of the first-diffracted order for a sinusoidal grating in the Bragg regime is found from the coupled-wave equations to be $DE_1^{III} = \sin^2(\gamma)$. From this approximate solution for $DE_1^{III}$, it is apparent that 100% diffraction efficiency is possible in the Bragg regime. FIG. 5A shows both the approximate solution and the RCWA for a Bragg regime grating constructed from a periodic aluminum composition variation in $Ga_{1-x}Al_xAs$. The aluminum composition variation in FIG. 5A is sinusoidal with $E-V_I=0.05eV$, $\Lambda=18$ nm, $x_I=x_{II}=x_{III}=0.1$, and $x_1=0.03$ where $x_I$ and $x_{III}$ are the aluminum composition in region I and III respectively, and $x_{II}$ and $x_1$ are the average and modulating aluminum composition (in region II), respectively. For this grating, $\rho_B=2.60$. As $\rho_B$ increases, the approximate solution approaches the exact analysis more and more closely, becoming indistinguishable around $\rho_B \approx 20$.

Figure 5B:
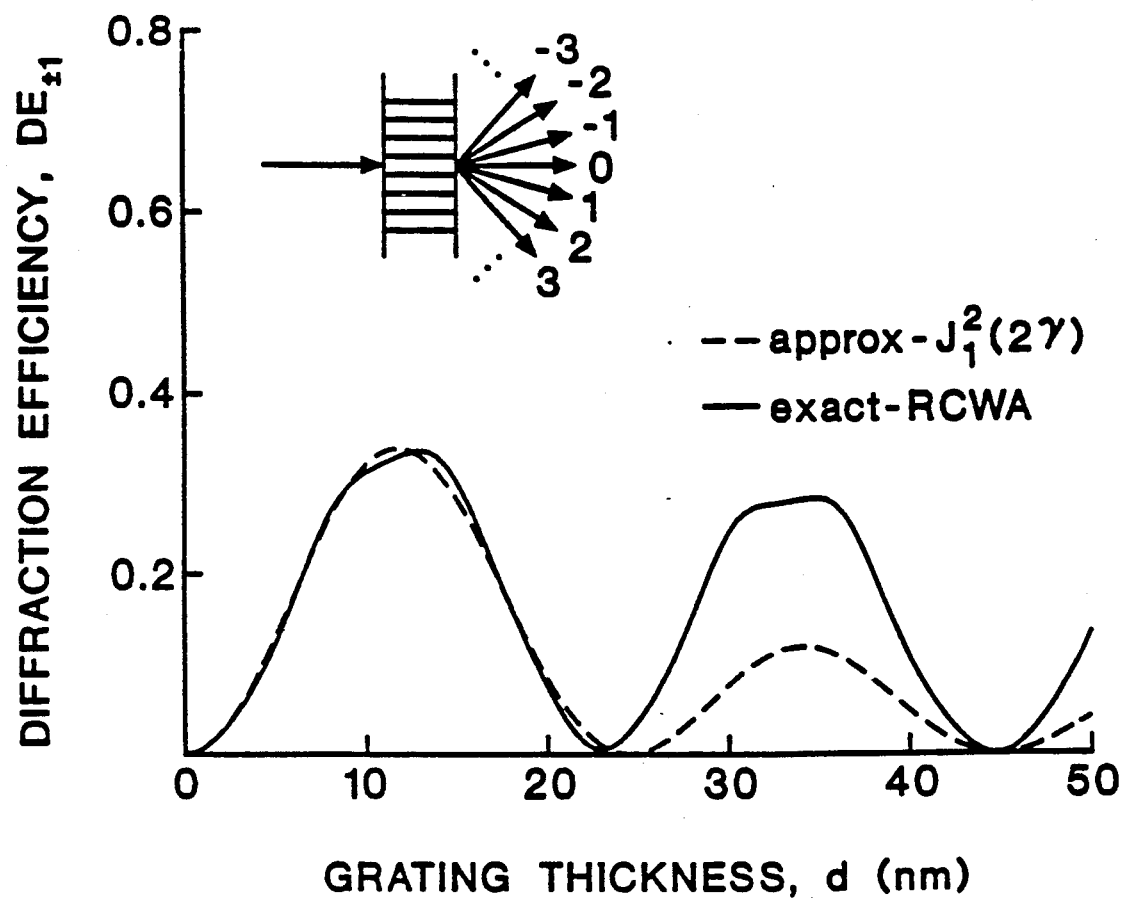
FIG. 5B is a schematic illustration of analytical performance results of the diffractive grating of FIG. 3 operating in the Raman-Nath regime, depicting diffraction efficiency as a function of grating thickness.

In the Raman-Nath regime, power is diffracted into multiple orders, and can be distributed almost evenly among many orders. This occurs when the Raman-Nath regime parameter $\rho_{RN} = Q'\gamma < 1$. In this regime, the approximate solution to the coupled-wave equations is $DE_i^{III} = J_i^2(2\gamma)$, where $J_i$ is an ith order ordinary Bessel function of the first kind. FIG. 5B shows the approximate solution and the RCWA (for $i=\pm 1$) for a Raman-Nath regime grating. The aluminum composition variation in FIG. 5B is sinusoidal with $E-V_I=0.05eV$, $\Lambda=60$ nm, $x_I=x_{II}=x_{III}=0.1$, and $x_1=0.03$ where $x_I$ and $x_{III}$ are the aluminum composition in region I and III respectively, and $x_{II}$ and $x_1$ are the average and modulating aluminum composition (in region II) respectively. This grating leaves the Raman-Nath regime at $d \approx 18$ nm, which explains the failure of the approximate analysis for $d > 20$ nm. It is important to note that the Bragg regime parameter $\rho_B$ is independent of the thickness, while the Raman-Nath regime parameter $\rho_{RN}$ is proportional to the square of the thickness.

Figure 6A:
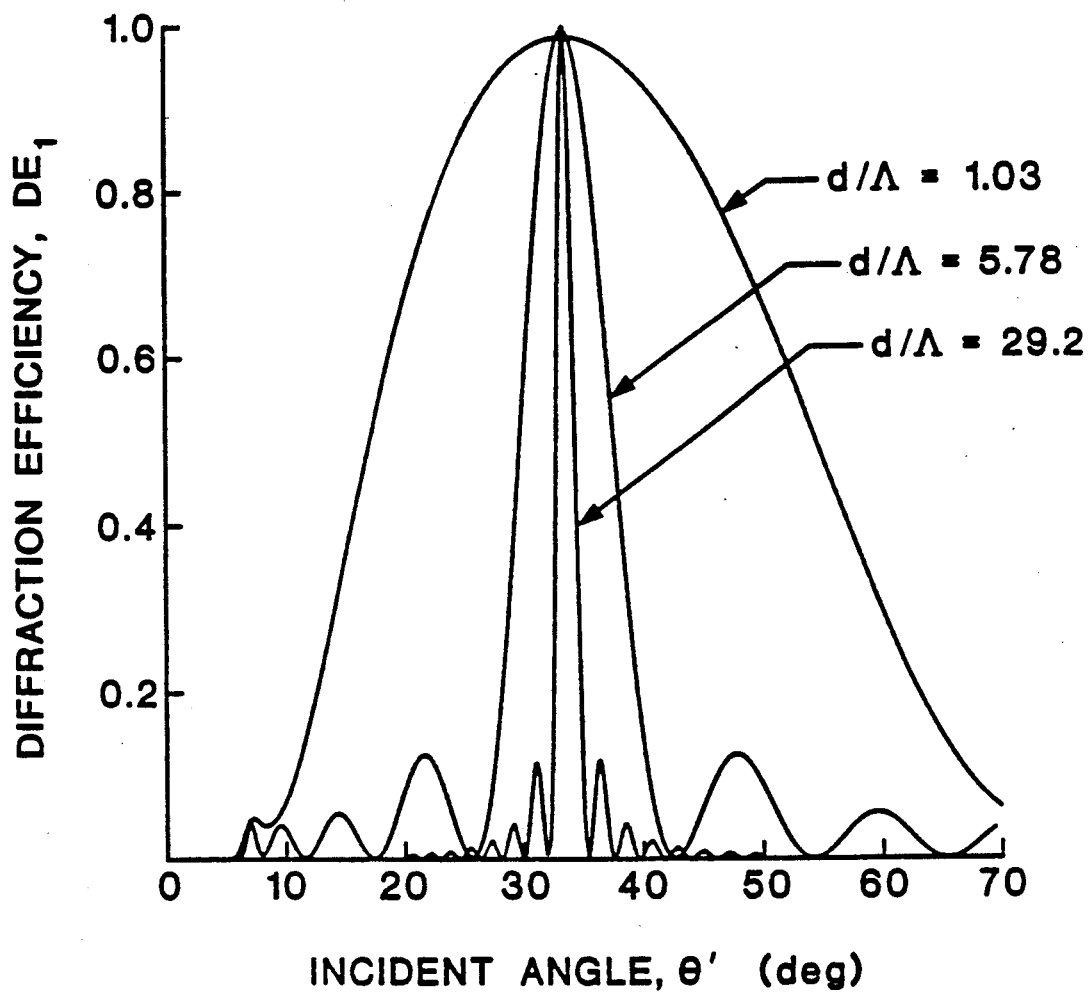
FIGS. 6A and 6B are schematic illustrations of analytical performance results of the diffractive grating of FIG. 3 operating in the Bragg regime, depicting diffraction efficiency as a function of incident angle and incident kinetic energy, respectively.
Figure 6B:
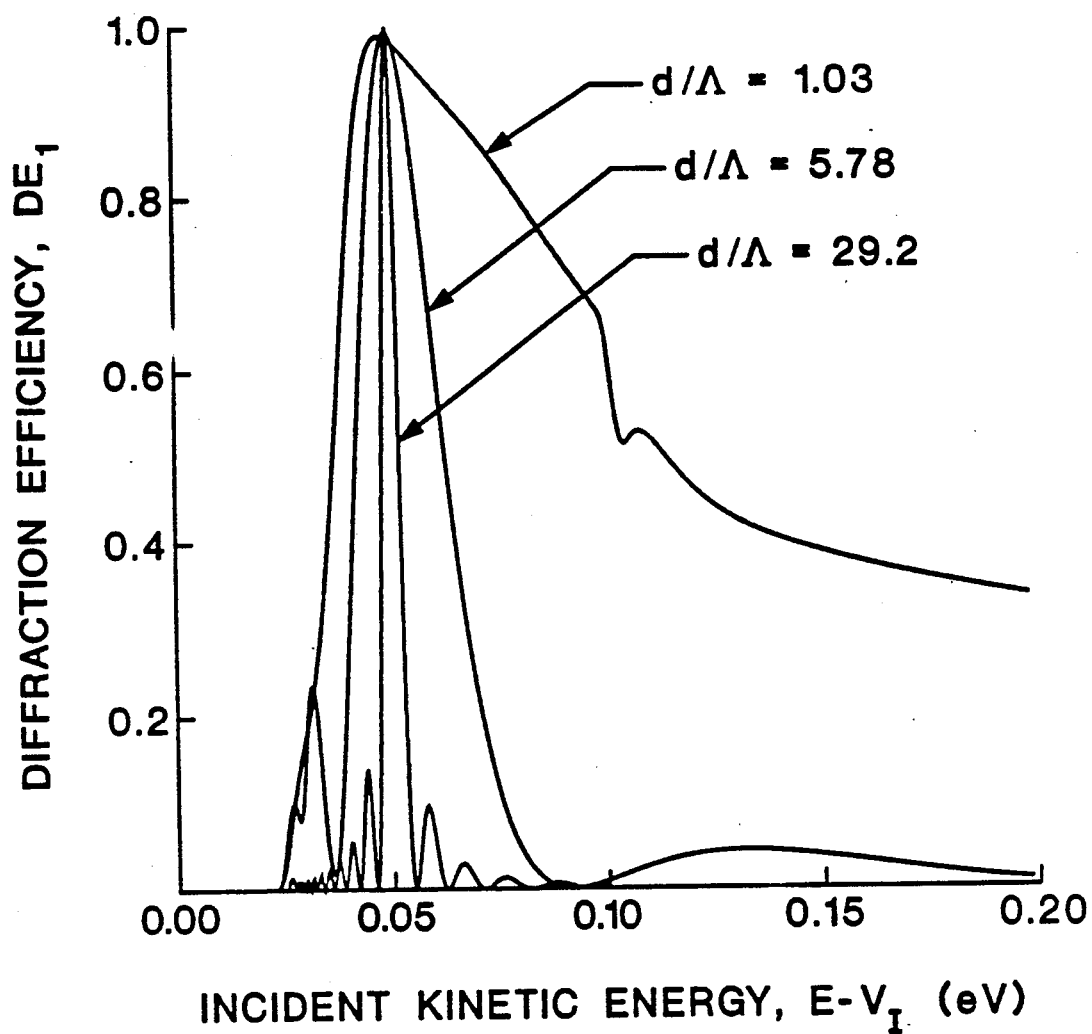

In real semiconductors, the electrons incident upon the grating have a distribution in both angle of incidence and energy. Therefore, it is important to understand the factors that affect the angular and energy selectivity of gratings. The angular (energy) selectivity describes the variation in the diffraction efficiency as the angle of incidence (energy) is changed. Strong angular (energy) selectivity refers to the case when the diffraction efficiency is appreciable for only a narrow corridor of angles of incidence (energies). It has been shown in electromagnetics that the angular and energy selectivity of a grating is a function of the ratio $d/\Lambda$. See, for example, T. K. Gaylord, and M. G. Moharam, "Thin and thick gratings: terminology clarification," *Applied Optics*, vol. 20, pp. 3271-3273, Oct. 1, 1981. An important and fundamental part of this invention is the recognition that the same parameter $d/\Lambda$ controls the angular and energy selectivity of a semiconductor grating. A "thick" grating ($d/\Lambda > 5$) exhibits strong angular and energy selectivity. As a grating becomes "thinner" ($d/\Lambda$ is decreased), the grating angular and energy selectivity become weaker. This behavior is demonstrated in FIGS. 6A (angular selectivity) and 6B (energy selectivity) for three Bragg regime gratings with thicknesses and aluminum modulations of $d/\Lambda = 1.03$ and $x_1 = 0.03$, $d/\Lambda = 5.78$ and $x_1 = 0.005$, and $d/\Lambda = 29.2$ and $x_1 = 0.001$. The suppression of the angular selectivity side lobes for angles less than 6.4° (FIG. 6A) is due to the fact that the $i = +1$ order becomes evanescent or "cutoff" at this angle of incidence (see Eq. (2)). In an analogous manner, the rapid drop in diffraction efficiency for kinetic energies around $E - V_I = 0.025$ eV (FIG. 6B) is due to the fact that the $i = +1$ order becomes evanescent at this energy. The sharp discontinuity in the diffraction efficiency for $E - V_I = 0.102$ eV (FIG. 6B) is analogous to a "Wood's anomaly" in electromagnetic optics and is due to the "cutting on" of the $i = +2$ order at this energy.

The design equations for Bragg regime, Raman-Nath regime, and "thin" and "thick" gratings presented herein provide a precise method for the design of a wide range of ballistic electron grating diffractive devices such as switches ($1 \times 1$ and $1 \times N$), energy multiplexors, energy spectrometers, and electron waveguide couplers. If one desires a device with nearly 100% diffraction efficiency in a given order (e.g. a $1 \times 1$ switch), then the following design steps should be followed. First, the grating should be designed such that the electron wave is incident at the Bragg condition (Eq. (3)). Then, the grating parameters should be chosen such that $\rho_B >> 1$. Finally, the thickness and grating modulation should be chosen such that $\gamma$ is a half-integer multiple of $\pi$ so that $DE_1 \approx 100\%$. For this case, the grating parameters can also be adjusted such that all orders other than $i = 0$ and $i = +1$ are cutoff (as in FIG. 6B).

If one desires a grating with a large diffraction efficiency divided among multiple orders (e.g. a $1 \times N$ switch), the following design steps should be followed. First, the grating should be designed (through the use Eq. (2)) to have many propagating forward-diffracted orders. Then, the grating parameters should be chosen such that $\rho_{RN} << 1$. Finally, the argument of the Bessel functions $(2\gamma)$ should be chosen to allow for a large diffraction efficiency in the desired orders. If one desires a grating with a large angular and energy selectivity (e.g. an energy multiplexor), then $d/\Lambda$ should be made large ($> 10$). If one desires a grating with a low angular and energy selectivity (e.g., a $1 \times 1$ switch with high diffracted current), then $d/\Lambda$ should be made small ($< 1$). By using these design rules, a wide variety of gratings can be designed for numerous applications. After the grating has been designed using the above procedures, the diffraction can be determined using the RCWA to test the performance and fine-tune the grating design.

Figure 7A:
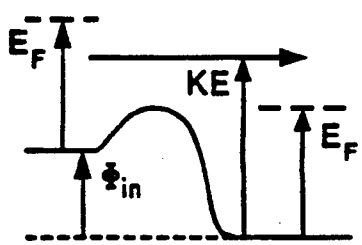
FIG. 7A is a schematic illustration of the conduction band profile (potential energy profile) as a function of distance (in the direction of propogation) of an electron injection portion of the device of FIG. 1.
Figure 7B:
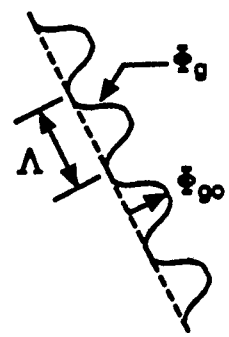
FIG. 7B is a schematic illustration of the conduction band profile of the diffraction grating of FIG. 1 operating in the Bragg regime as a function of gate voltage and lateral dimension.

Using this inventive technique, a ballistic electron diffractive switch (FIG. 1) and multiplexor (FIG. 2) can be designed and fabricated. The designs shown in FIG. 1 and 2 use external periodic electrodes ($GR_B$ in FIG. 1 and $GR_{RN}$ in FIG. 2) in the two-dimensional electron gas configuration to produce the grating and the collimating structure. The invention, however, is not limited to this configuration. In this two-dimensional electron gas configuration, there is a sea of electrons (inside a semiconductor) in a two-dimensional plane below the surface shown in FIGS. 1 and 2. The potential energy of the electrons below the surface can be changed by applying a fixed voltage to the electrodes shown in FIGS. 1 and 2. By applying a potential ($V_g$) to the periodic gate electrode ($GR_B$ in FIG. 1 and $GR_{RN}$ in FIG. 2), a periodic potential modulation (a grating) is formed. The amplitude of the grating modulation ($\Phi_{go}$) is a function of the gate voltage $V_g$. By applying a large potential to the injector electrodes ($I_o$ and $I_1$), a potential barrier is formed under these electrodes, through which the electrons can not pass. Thus, the injected electrons are those that can pass through the gaps in between the potential barriers. In this way, the electrons injected into the structure are those that are collimated in the direction from the injector to the grating. In both devices, (shown in FIGS. 1 and 2) the electrons are emitted from contact E, collimated by contacts $I_o$ and $I_1$, and diffracted by a potential grating $\Phi_g$ created by applying a potential $V_g$ to a periodic gate structure. Each diffracted order $i$ propagates away from the grating in the direction $\theta_i$ and is collected by gates $G_i$, $G'_i$ and collector $C_i$. The gate electrodes $G_i$ and $G'_i$ (where i is a positive or negative integer) are used to collect the ith diffracted order, by allowing in only the electrons that propagate through the slit between the electrodes. FIGS. 7A and 7B show the conduction band (potential energy) profile of the injector and the grating, respectively. The kinetic energy KE of the injected electrons is controlled by the potential $\Phi_{in}$ (FIG. 7A and 7B). The Fermi energy, $E_f$, in all regions (with no gate potentials) is 7.0meV.

Figure 7C:
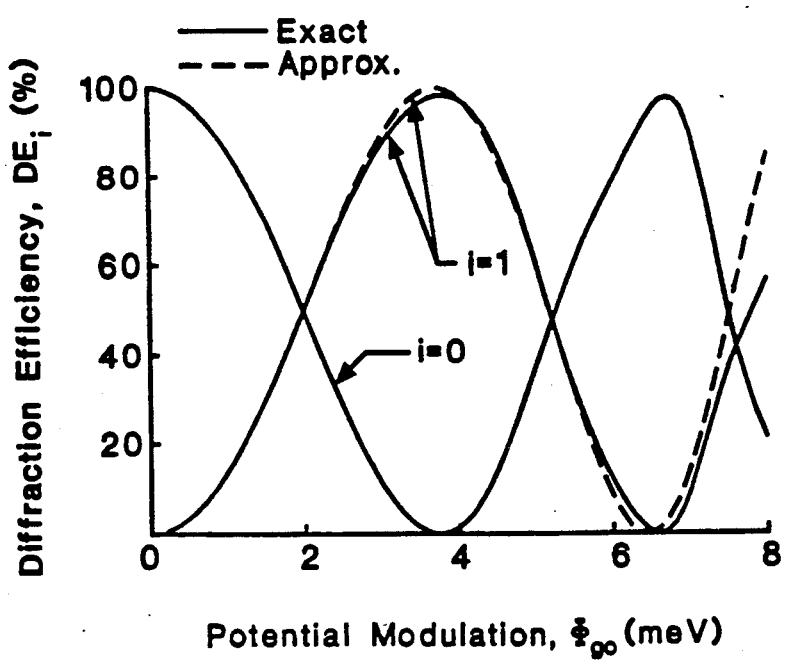
FIG. 7C is a schematic illustration of analytical performance results of the diffractive grating portion of the device of FIG. 1 operating in the Bragg regime, depicting diffraction efficiency as a function of potential modulation.

The diffractive switch (FIG. 1) was designed in the Bragg regime with a period of $\Lambda = 60$ nm, thickness $d = 150$ nm, and angle of incidence $\theta' = 24.6$ degrees, such that only the $i = 0$ and $i = 1$ diffracted orders have significant diffracted current. The grating diffraction efficiency $DE_i$ is shown in FIG. 7C as a function of the potential modulation for the design energy $KE = -KE_D = 9$meV. If the device is to be used as a switch, the current at $KE_D$ in the first diffracted order can be switched from 0% to 98% of the input current by applying a potential modulation of $\Phi_{go} = 3.6$meV ($V_g \sim 1$ V). This device could also be biased in the linear region ($\Phi_{go} = 1.8$ meV) where the current in the first diffracted order is linearly modulated by $V_g$. The total diffraction efficiencies are found by evaluating $T_i = \int DE_i f(KE) dKE / \int f(KE) dKE$, where $f(KE)$ is the injected electron distribution. The function $f(KE)$ would be peaked about $KE_D$ and would lie between a delta function $f_\delta(KE) = \delta(KE - KE_D)$ and the Fermi-Dirac function $f_{FD}(KE)$, yielding $T_0 = 7.2\%$ and $T_1 = 98-91\%$. The characteristics of this switch are summarized in Table I below.

In order to have significant current in multiple diffracted orders, the diffractive multiplexor (FIG. 2) was designed to be in the Raman-Nath regime with period $\Lambda = 250$ nm and thickness $d = 100$ nm. The multiplexor diffraction efficiencies for $KE_D$ are shown in FIG. 8C as a function of potential modulation. It is apparent that at $\Phi_{go} = 3.8$ meV, the multiplexor has an almost equal amount of current in 5 orders: $T_{\pm 2} = 18-19\%$, $T_{\pm 1} = 22-21\%$, and $T_0 = 16\%$, yielding a total efficiency of 96%. Such a multiplexor can be designed for any odd number of output orders. The multiplexor characteristic are summarized in Table II below.

Figure 9:
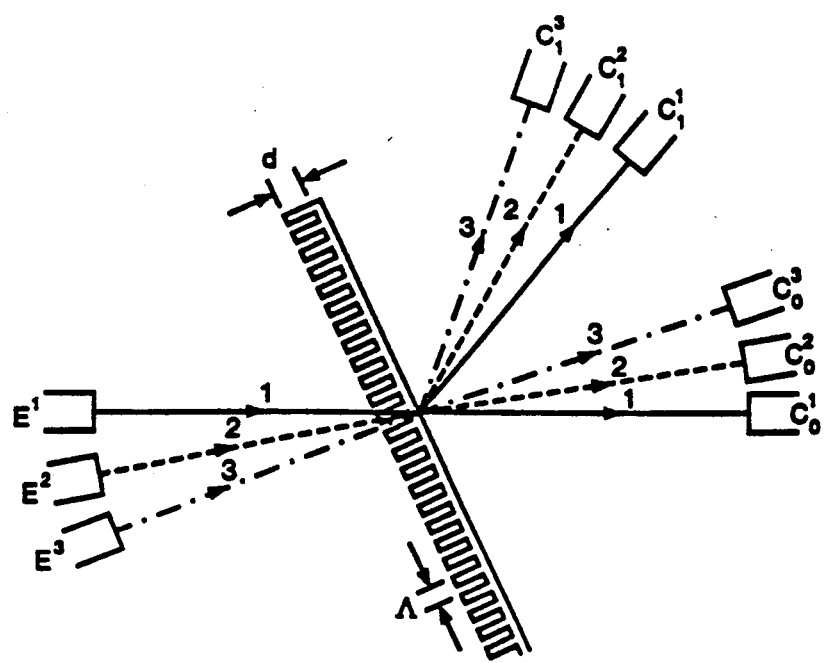
FIG. 9 is a schematic illustration of a multiple-pole, double-throw interconnection switch according to a preferred form of the invention.

The grating devices disclosed in this invention can also be used as multiple-pole switches for communications and interconnection applications. Specifically, a single grating can be used to connect multiple input beams to multiple outputs. FIG. 9 shows an example of such an interconnection scheme (operating in the Bragg regime) where a single grating is used to switch three input beams (1, 2, and 3) between two sets of three output beams. The beams 1, 2, and 3 are injected through emitters $E^1$, $E^2$ and $E^3$, and the two outputs $i=0$ and $i=1$ are collected with collectors $C_i^1$, $C_i^2$, and $C_i^3$, respectively. Such an interconnection scheme is not limited, however, to three beams and/or two outputs per input. A single grating device could potentially be used to connect a large number of input beams to a large number of outputs, allowing for extremely dense, high speed electronic interconnections.

The semiconductor growth and fabrication techniques discussed above, such as molecular beam epitaxy, metalorganic chemical vapor deposition, and nanolithography, have been used to produce periodic structures, such as superlattices, arrays of quantum wires, and periodic gate structures, whose periods are on the order of electron wavelengths in semiconductors. These growth procedures can be used to produce the periodic grating structures in the present invention. Such semiconductor grating structures could be fabricated in III-V semiconductors, such as $Ga_{1-x}Al_xAs$. FIGS. 4A–4E show examples of such grating structures fabricated out of: (a) laterally connected electrodes 31–34, (b) vertically connected electrodes 36–39, (c) an array of quantum wires 41–44, (d) a vicinal array of quantum wires 46–49, and (e) a laterally oriented superlattice 51. All of these structures in FIG. 4A–4E can be used to generate a periodic modulation in effective mass and/or potential energy for devices according to the present invention. In the preceding description, devices are presented in which the grating modulation is varied through the application of an electric field (voltage) to a gate electrode. The invention, however, is not limited to using this field. The grating modulation can be varied through the application of other external fields, such as magnetic fields, or strain fields, with similar results.

Previous analyses of electron wave diffraction in semiconductors have been limited to the use of a two-mode amplitude transmittance analysis (to model diffraction from a symmetric rectangular potential-energy grating), and a Fraunhoufer analysis (to model single-slit diffraction). Devices according to the present invention include the following advantages. First, a rigorous coupled-wave analysis (RCWA) has been developed that can model ballistic electron wave diffractive device with an arbitrary effective mass and/or potential energy grating to an arbitrary level of accuracy. Second, simple design expressions have been presented to determine the angles of propagation for the diffracted waves and to identify the evanescent orders. Third, the design constraints required to achieve devices in the Bragg and Raman-Nath regimes have been identified. Fourth, complete design methods for grating diffractive devices have developed and presented.

TABLE I

Bragg Diffractive Switch ($\Phi_{go} = 3.8$ meV)

| Order | $\theta_i$ [°] for $h^{[2]} = 3$, KE [meV] | | | $(DE_i - \widetilde{DE}_i^{[1]})$ [%] for KE = $KE_D$, $h^{[2]}$ | | | $DE_i$ [%] for $h^{[2]} = 3$, KE [meV] | | | $T_i$ [%] for $h^{[2]} = 3$, f (KE) | |
|---|---|---|---|---|---|---|---|---|---|---|---|
| i | 7 | 9 | 11 | 1 | 3 | 5 | 7 | 9 | 11 | $f_\delta$ | $f_{FD}$ |
| 0 | −24.6 | −24.6 | −24.6 | 0.0 | −1.4 | −1.5 | 21.4 | 0.0 | 9.4 | 0.0 | 7.2 |
| 1 | 31.8 | 24.6 | 19.7 | −1.4 | −1.4 | −1.4 | 75.2 | 98.2 | 90.3 | 98.2 | 91.2 |
| | | | | | | | | | Total: | 98.2 | 98.4 |

[1]$\widetilde{DE}_i$ = diffraction efficiency using approximate theory
[2]h = the number of harmonics in the Fourier expansion of $\Phi_g$

TABLE II

Raman-Nath Diffractive Multiplexor ($\Phi_{go} = 3.6$ meV)

| Order | $\theta_i$ [°] for $h^{[2]} = 3$, KE [meV] | | | $(DE_i - \widetilde{DE}_i^{[1]})$ [%] for KE = $KE_D$, $h^{[2]}$ | | | $DE_i$ [%] for $h^{[2]} = 3$, KE [meV] | | | $T_i$ [%] for $h^{[2]} = 3$, f (KE) | |
|---|---|---|---|---|---|---|---|---|---|---|---|
| i | 7 | 9 | 11 | 1 | 3 | 5 | 7 | 9 | 11 | $f_\delta$ | $f_{FD}$ |
| −2 | −26.9 | −23.5 | −21.1 | 2.9 | 9.9 | 9.1 | 22.6 | 18.1 | 14.2 | 18.1 | 18.6 |
| −1 | −13.9 | −11.5 | −10.4 | −2.2 | −13.0 | −11.8 | 18.1 | 22.0 | 22.4 | 22.0 | 21.4 |
| 0 | 0.0 | 0.0 | 0.0 | 2.5 | 4.6 | 4.0 | 8.4 | 16.3 | 23.9 | 16.3 | 15.9 |
| 1 | −13.9 | −11.5 | −10.4 | −2.2 | −13.0 | −11.8 | 18.1 | 22.0 | 22.4 | 22.0 | 21.4 |
| 2 | −26.9 | −23.5 | −21.1 | 2.9 | 9.9 | 9.1 | 22.6 | 18.1 | 14.2 | 18.1 | 18.6 |
| | | | | | | | | | Total: | 96.5 | 95.9 |

[1]$\widetilde{DE}_i$ = diffraction efficiency using approximate theory
[2]h = the number of harmonics in the Fourier expansion of $\Phi_g$ While the present invention has been disclosed in preferred forms, it will be obvious to those skilled in the art that many modifications, additions, and deletions may be made therein without departing from the spirit and scope of the invention as set forth in the appended claims.

We claim:

1. A solid state, quantum mechanical, electron/hole wave switching device comprising:
   a layer of semiconductor material which supports substantially ballistic electron/hole transport; and
   a diffraction grating structure formed in said layer of semiconductor material comprising a modulation in electron/hole potential energy and/or effective mass for diffracting at least one input electron/hole beam into at least two separate output electron/hole beams.

2. The switching device of claim 1 wherein said grating structure is adapted to diffract an input electron/hole beam substantially completely into two output electron/hole beams to function as a switch.

3. The switching device of claim 1 wherein said grating structure is adapted to operate in the Bragg regime.

4. The switching device as claimed in claim 1 wherein said grating structure is adapted for diffracting an input electron/hole beam into three or more output electron/hole beams to form a multiplexor.

5. The switching device of claim 1 wherein said grating structure is adapted to operate in the Raman-Nath regime.

6. The switching device of claim 1 further comprising means for applying and varying said modulation.

7. The switching device of claim 1 further comprising input collimating means for collimating the input beam and output collimating means for collimating said output beams.

8. The switching device of claim 1 further comprising an emitter means for generating the input beam and collector means for collecting said output beams.

9. The switching device of claim 8 wherein said collector means comprises two collector elements.

10. The switching device of claim 8 wherein said collector means comprises at least three collector elements.

11. The switching device of claim 1 wherein said grating structure is adapted to divide the input beam into roughly equal output beams.

12. The switching device of claim 1 further comprising a means for applying said grating modulation.

13. The switching device of claim 12 wherein said means for applying the grating modulation comprises a periodic set of metallic electrodes positioned adjacent a surface portion of said semiconductor layer and a fixed bias voltage applied to said electrodes.

14. The switching device of claim 12 wherein said means for applying the grating modulation comprises a set of superlattice layers.

15. The switching device of claim 12 wherein said means for applying the grating modulation comprises an array of quantum wires.

16. The switching device of claim 12 wherein said means for applying the grating modulation comprises an array of electrode gate structures.

17. The switching device of claim 12 further comprising external field means for varying the grating modulation.

18. The switching device of claim 17 wherein said external field means comprises an electric field applied to a gate electrode structure.

19. The switching device of claim 18 wherein said gate electrode structure is periodic.

20. The switching device of claim 1 wherein
   the input electron/hole beam is incident upon the grating at an energy E,
   the grating is characterized by an angle of incidence, grating period, grating slant angle, grating average electron/hole effective mass, grating average electron/hole potential energy, grating modulated electron/hole effective mass profile, and grating modulated electron/hole potential energy profile,
   the switching device is constructed in accordance with the following in order to divide substantially all of the input beam of electrons/holes into two output beams, designated as the $i=0$ and $i=i_a$ electron/hole beams where $i_a$ is a positive or negative integer corresponding to a forward or a backward diffracted order:
   the grating period and grating slant angle are determined for said grating device which will make the $i_a$ backward- or forward-diffracted orders propagating, by having the propagating orders satisfy the grating equation for real angles $\theta'_{ia}$ or $\theta''_{ia}$:

$$[2m^*_I(E-V_I)]^{\frac{1}{2}}\sin\theta' - (2\pi i_a \hbar/\Lambda)\sin\phi = r_n[2m^*_n(E-V_n)]^{\frac{1}{2}}\sin\theta^n_{ia}$$

where
   $n=I,III$
   $r_I=-1$
   $r_{III}=1$
   $\theta^I_{ia}=\theta'_{ia}$ and $\theta^{III}_{ia}=\theta''_{ia}$ are the angles (measured positive counter-clockwise from the grating surface normal) of propagation of the $i_a$th backward- or forward-diffracted orders respectively,
   $m^*_I$ and $m^*_{III}$ are the electron/hole effective mass of the input and output regions respectively,
   $V_I$ and $V_{III}$ are the electron/hole potential energy of the input and output regions respectively,
   $\Lambda$ is the grating period,
   $\phi$ is the grating slant angle
   $\pi$ is the irrational number 3.14159 . . .
   $\hbar$ is Planck's constant divided by $2\pi$, the grating average election/hole effective mass, the grating average electron/hole potential energy, and angle $\theta'$ are selected such that they satisfy the Bragg condition for the $i_a$th diffracted order:

$$\sqrt{2m^*_{II}(E-V_{II})} = i_a\pi\hbar/\Lambda\cos(\theta-\phi),$$

where
   $m^*_{II}$ is the average grating electron/hole effective mass,
   $V_{II}$ is the average grating electron/hole potential energy
   $\theta$ is the angle $\theta'$ refracted into the grating
   $\Lambda$ is the grating period
   $\phi$ is the grating slant angle
   $\pi$ is the irrational number 3.14159 . . .
   $\hbar$ is Planck's constant divided by $2\pi$, and the grating electron/hole modulated effective mass profile and electron/hole modulated potential energy profile are selected such that the first harmonic of an exponential Fourier series of the effective mass profile and the first harmonic of an exponential Fourier series of the potential energy profile satisfy the Bragg regime equation:
   $\rho_B=Q'/2\gamma>1$, where
- $\rho_B$ is the Bragg regime parameter,
- $Q'$ is the grating thickness parameter, and
- $\gamma$ is the grating strength parameter.

21. The switching device of claim 20 wherein the grating also is constructed according to the following: the effective grating thickness, $d/\Lambda$, is made larger than approximately five such that the grating has substantial diffracted current for the $i_a$th order for only a small range of incident angles around $\theta'$ and a small range of energies around E.

22. The switching device of claim 20 wherein the grating also is constructed according to the following: the effective grating thickness, $d/\Lambda$, is made smaller than approximately five such that the grating has substantial diffracted current for the $i_a$th order for a broad range of incident angles around $\theta'$ and a broad range of energies around E.

23. The switching device of claim 1 wherein the input electrons/holes are incident upon the device at an angle $\theta'$ and an energy E,
wherein the grating structure is characterized by a grating period, grating slant angle, grating average electron/hole effective mass, grating average electron/hole potential energy, grating modulated electron/hole effective mass profile, and grating modulated electron/hole potential energy profile,
and wherein the grating structure is constructed in accordance with the following so as to produce numerous diffracted beams of electrons/holes of substantially the same current:
the grating period and grating slant angle are determined which will give desired number and directions of backward- and forward-diffracted orders, by having the propagating orders satisfy the grating equation for real angles $\theta'_i$ and $\theta''_i$:

$$[2m^*_I(E-V_I)]^{\frac{1}{2}}\sin\theta' - (2\pi n\hbar/\Lambda)\sin\phi = r_n[2m^*_n(E-V_n)]^{\frac{1}{2}}\sin\theta''_i$$

where
- $n = I, III$
- $r_I = -1$
- $r_{III} = 1$
- $\theta^I_i = \theta'_i$ and $\theta^{III}_i = \theta''_i$ are the angles (measured positive counter-clockwise from the grating surface normal) of propagation of the ith backward- or forward-diffracted orders respectively,
- $m^*_I$ and $m^*_{III}$ are the electron/hole effective mass of the input and output regions respectively,
- $V_I$ and $V_{III}$ are the electron/hole potential energy of the input and output regions respectively,
- $\Lambda$ is the grating period,
- $\phi$ is the grating slant angle,
- $\pi$ is the irrational number 3.14159...,
- $\hbar$ is Planck's constant divided by $2\pi$, and the grating thickness, electron/hole modulated effective mass profile, and electron/hole modulated potential energy profile are selected such that the grating thickness, the first harmonic of an exponential Fourier series of the effective mass profile, and the first harmonic of an exponential Fourier series of the potential energy profile satisfy the Raman-Nath regime equation:

$$\rho_{RN} = Q'\gamma > 1$$

where
- $\rho_{RN}$ is the Raman-Nath regime parameter
- $Q'$ is the grating thickness parameter, and
- $\gamma$ is the grating strength parameter.

24. The device of claim 23 wherein the grating also is constructed according to the following: the effective grating thickness, $d/\Lambda$, is made larger than five such that the grating has substantial diffracted current for the ith order for only a small range of incident angles around $\theta'$ and a small range of energies around E.

25. The device of claim 23 wherein the grating also is constructed according to the following: the effective grating thickness, $d/\Lambda$, is made smaller than five such that the grating has substantial diffracted current for the ith order for only a broad range of incident angles around $\theta'$ and a broad range of energies around E.

26. A solid state, quantum mechanical, electron/hole wave device comprising a layer of semiconductor material which supports substantially ballistic electron/hole transport at energies above the conduction band and a diffraction grating structure formed in said layer of semiconductor material, said diffraction grating structure comprising a modulation in electron/hole potential energy and/or effective mass for diffracting an input electron/hole beam substantially completely into first and second separate output electron/hole beams.

27. The device of claim 26 wherein said grating structure is adapted to divide an input beam of electrons/holes into one of said first and second output beams of electrons/holes with substantially all of the input beam current and the other of said first and second output beams of electrons/holes with substantially none of the input beam current.

28. The device of claim 26 wherein said grating structure is adapted to divide an input beam of electrons/holes substantially equally into said first and second output beams of electrons/holes.

29. The device of claim 26 wherein said first output beam has an arbitrary selected portion of the input beam current and said second output beam has substantially the remainder of the input beam current.

30. The device of claim 26 further comprising a means for applying said grating modulation.

31. The device of claim 30 wherein said means for applying the grating modulation comprises a periodic set of metallic electrodes positioned adjacent a surface portion of said semiconductor layer and a fixed bias voltage applied to said electrodes.

32. The device of claim 30 wherein said means for applying the grating modulation comprises a set of superlattice layers.

33. The device of claim 30 wherein said means for applying the grating modulation comprises an array of quantum wires.

34. The device of claim 30 wherein said means for applying the grating modulation comprises an array of electrode gate structures.

35. The device of claim 30 further comprising external field means for varying the grating modulation.

36. The device of claim 35 wherein said external field means comprises an electric field applied to a gate electrode structure.

37. The device of claim 36 wherein said gate electrode structure is periodic.

38. The device of claim 26 further comprising input collimating means for collimating the input beam and first and second output collimating means for collimating said first and second output beams.

39. The device of claim 26 further comprising an emitter means for generating the input beam and first and second collector means for collecting said first and second output beams.

40. The device of claim 39 wherein said emitter means comprises means for generating a plurality of input beams which are incident upon said grating structure.

41. The device of claim 26 wherein
the input electron/hole beam is incident upon the grating at an energy E,
the grating is characterized by an angle of incidence, grating period, grating slant angle, grating average electron/hole effective mass, grating average electron/hole potential energy, grating modulated electron/hole effective mass profile, and grating modulated electron/hole potential energy profile,
the device being constructed in accordance with the following in order to divide substantially all of the input beam of electrons/holes into two output beams, designated as the i=0 and i=$i_a$ electron/hole beams where $i_a$ is a positive or negative integer corresponding to a forward or a backward diffracted order:
the grating period and grating slant angle are determined for said grating device which will make the $i_a$ backward- or forward-diffracted orders propagating, by having the progagating orders satisfy the grating equation for real angles $\theta'_{ia}$ or $\theta''_{ia}$:

$$[2m^*_I(E-V_I)]^{\frac{1}{2}} \sin \theta' - (2\pi i_a \hbar/\Lambda) \sin \phi = r_n[2m^*_n(E-V_n)]^{\frac{1}{2}} \sin \theta^n_{ia}$$

where
n=I,III
$r_I=-1$
$r_{III}=1$
$\theta^I_{ia}=\theta'_{ia}$ and $\theta^{III}_{ia}=\theta''_{ia}$ are the angles (measured positive counter-clockwise from the grating surface normal) of propagation of the $i_a$th backward- or forward-diffracted orders respectively,
$m^*_I$ and $m^*_{III}$ are the electron/hole effective mass of the input and output regions respectively,
$V_I$ and $V_{III}$ are the electron/hole potential energy of the input and output regions respectively,
$\Lambda$ is the grating period,
$\phi$ is the grating slant angle,
$\pi$ is the irrational number 3.14159...,
h is Planck's constant divided by $2\pi$,
the grating average electron/hole effective mass, the grating average electron/hole potential energy, and angle $\theta'$ are selected such that they satisfy the Bragg condition for the $i_a$th diffracted order:

$$\sqrt{2m^*_{II}(E-V_{II})} = i_a\pi\hbar/\Lambda\cos(\theta-\phi)$$

where
$m^*_{II}$ is the average grating electron/hole effective mass,
$V_{II}$ is the average grating electron/hole potential energy,
$\theta$ is the angle $\theta'$ refracted into the grating,
$\Lambda$ is the grating period,
$\phi$ is the grating slant angle,
$\pi$ is the irrational number 3.14159...,
$\hbar$ is Planck's constant divided by $2\pi$, and the grating electron/hole modulated effective mass profile and electron/hole modulated potential energy profile are selected such that the first harmonic of an exponential Fourier series of the effective mass profile and the first harmonic of an exponential Fourier series of the potential energy profile satisfy the Bragg regime equation:

$$\rho_B = Q'/2\gamma > 1,$$

where
$\rho_B$ is the Bragg regime parameter,
$Q'$ is the grating thickness parameter, and
$\gamma$ is the grating strength parameter.

42. The device of claim 41 wherein the grating also is constructed according to the following: the effective grating thickness, $d/\Lambda$, is made larger than five (5.0) such that the grating has substantial diffracted current for the $i_a$th order for only a small range of incident angles around $\theta'$ and a small range of energies around E.

43. The device of claim 41 wherein the grating also is constructed according to the following: the effective grating thickness, $d/\Lambda$, is made smaller than approximately five such that the grating has substantial diffracted current for the $i_a$th order for a broad range of incident angles around $\theta'$ and a broad range of energies around E.

44. A solid state, quantum mechanical, electron/hole wave device comprises:
a layer of semiconductor material which supports substantially ballistic electron/hole transport at energies above the conduction band edge; and
a grating structure formed in the layer of semiconductor material and comprised of a modulation in electron/hole potential engergy and/or effective mass for diffracting substantially all of an input electron/hole beam into three or more output electron/hole beams.

45. The device of claim 44 wherein said grating is adapted to divide substantially all of the input beam of electrons/holes substantially equally among multiple output beams.

46. The device of claim 44 further comprising means for applying the grating modulation.

47. The device of claim 46 wherein said means for applying the grating modulation comprises a set of metallic electrodes adjacent a surface portion of said semiconductor layer and a fixed bias voltage applied to said electrodes.

48. The device of claim 46 wherein said means for applying the grating modulation comprises a set of superlattice layers.

49. The device of claim 46 wherein said means for applying the grating modulation comprises an array of quantum wires.

50. The device of claim 46 wherein said means for applying the grating modulation comprises an array of electrode gate structures.

51. The device of claim 46 further comprising external field means for varying the grating modulation.

52. The device of claim 51 wherein said external field means comprises an electric field applied to a gate electrode structure.

53. The device of claim 52 wherein said gate electrode structure is periodic.

54. The device of claim 44 wherein the input electrons/holes are incident upon the device at an angle $\theta'$ and an energy E,
wherein the grating structure is characterized by a grating period, grating slant angle, grating average electron/hole effective mass, grating average electron/hole potential energy, grating modulated electron/hole effective mass profile, and grating modulated electron/hole potential energy profile, and wherein the grating structure is constructed in accordance with the following so as to produce numerous diffracted beams of electrons/holes of substantially the same current:

the grating period and grating slant angle are determined which will give desired number and directions of backward- and forward-diffracted orders, by having the propagating orders satisfy the grating equation for real angles $\theta'_i$ and $\theta''_i$:

$$[2m^*_I(E-V_I)]^{\frac{1}{2}} \sin \theta' - (2\pi \bar{h}/\Lambda) \sin \phi = r_n[2m^*_n(E-V_n)]^{\frac{1}{2}} \sin \theta^n_i$$

where
 n = I, III
 $r_I = -1$
 $r_{III} = 1$
 $\theta'_i = \theta^I_i$ and $\theta^{III}_i = \theta''_i$ are the angles (measured positive counter-clockwise from the granting surface normal) of propagation of the ith backward- or forward-diffracted orders respectively,
 $m^*_I$ and $m^*_{III}$ are the electron/hole effective mass of the input and output regions respectively,
 $V_I$ and $V_{III}$ are the electron/hole potential energy of the input and output regions respectively,
 $\Lambda$ is the grating period,
 $\phi$ is the grating slant angle,
 $\pi$ is the irrational number 3.14159...,
 $\bar{h}$ is Planck's constant divided by $2\pi$, and the grating thickness, electron/hole modulated effective mass profile, and electron/hole modulated potential energy profile are selected such that the grating thickness, the first harmonic of an exponential Fourier series of the effective mass profile, and the first harmonic of an exponential Fourier series of the potential energy profile satisfy the Raman-Nath regime equation:

$$\rho_{RN} = Q'\gamma > 1$$

where
 $\rho_{RN}$ is the Raman-Nath regime parameter,
 $Q'$ is the grating thickness parameter, and
 $\gamma$ is the grating strength parameter.

55. The device of claim 54 wherein the grating also is constructed according to the following: the effective grating thickness, $d/\Lambda$, is made larger than approximately five such that the grating has substantially diffracted current for the ith order for a small range of incident angles around $\theta'$ and a small range of energies around E.

56. The device of claim 54 wherein the grating also is constructed according to the following: the effective grating thickness, $d/\Lambda$, is made smaller than approximately five such that the grating has substantial diffracted current for the ith order for a broad range of incident angles around $\theta'$ and a broad range of energies around E.

57. The device of claim 44 further comprising means for generating an input beam, means for collimating the input beam, and collector means for collecting output beams.

58. The device of claim 57 wherein said means for generating an input comprises means for generating a plurality of input beams.

* * * * *

UNITED STATES PATENT AND TRADEMARK OFFICE
CERTIFICATE OF CORRECTION

PATENT NO. : 5,191,216            Page 1 of 3
DATED : March 2, 1993
INVENTOR(S) : Gregory N. Henderson, et al.

It is certified that error appears in the above—identified patent and that said Letters Patent is hereby corrected as shown below:

In the drawings, Sheet 10, Change "FIG. A" to --FIG. 8A--.

Column 4 (Page 14)

col. 4, line 26    "$\pi$" should be "$\Lambda$"
col. 4, line 31    "$\bar{k}'$" is not straight on line.
col. 4, line 38, Eq. (1)    "r" should be "$\bar{r}$" in two places.
col. 4, line 41    "h" should be "$\hbar$"
col. 4, line 47    "$\alpha$" should be "$\infty$" in two places.
col. 4, line 51    "$\alpha$" should be "$\infty$"
col. 4, line 51    "$\alpha$" (very small in size) should be "$\infty$"
col. 4, line 54    "$\psi$" (small in size) should be regular size.
col. 4, line 54    "$\Sigma$" (small in size) should be regular size.
col. 4, line 54    "$\alpha$" should be "$\infty$"
col. 4, line 54    "$\alpha$" (very small in size) should be "$\infty$"

Column 5 (Page 15)

col. 5, line 45    Remove "-" at end of line.
col. 5, line 46    "|" should be "/"

Column 6 (Page 15)

col. 6, line 32    "h" should be "$\hbar$"
col. 6, line 32    square root overbar should extend only to cover "$V_{II}$)" It should not cover "$\Lambda^2$"
col. 6, line 36    "$V_1$" should be "$V_I$"
col. 6, line 37    "h" should be "$\hbar$"
col. 6, line 37    "$m_1^*$" should be "$m_I^*$"
col. 6, line 37    "$V_1$" should be "$V_I$"

UNITED STATES PATENT AND TRADEMARK OFFICE
CERTIFICATE OF CORRECTION

PATENT NO. : 5,191,216
DATED : March 2, 1993
INVENTOR(S) : Gregory N. Henderson, et al.

It is certified that error appears in the above—identified patent and that said Letters Patent is hereby corrected as shown below:

Column 9 (Page 17)

col. 9, line 3   "KE|∫(KE)" should be "KE/∫f(KE)"
col. 9, line 7   "-7.2%" should be "-0-7%"

Column 12 (Page 18)

col. 12, line 23   "$m^*$-" should be "$m_n^*$"
col. 12, line 24   "$_n$" should be removed
~~(together with~~ correction to line 23)

Column 13 (Page 19)

col. 13, line 37   "$m^*$-" should be "$m_n^*$"
col. 13, line 38   "$_n$" should be removed
~~(together with correction~~ to line 37)
col. 13, line 64   ">" should be "<"

Column 15 (Page 20)

col. 15, line 28   "sin" should be "sin$\phi$"
col. 15, line 29   "$\phi$" should be deleted
                   ~~(together with correction to line 28)~~
col. 15, line 30   "$m_1^*$" should be "$m_I^*$"
col. 15, line 46   "h" should be "$\hbar$"
col. 15, line 53   "h" should be "$\hbar$"

UNITED STATES PATENT AND TRADEMARK OFFICE
CERTIFICATE OF CORRECTION

PATENT NO. : 5,191,216
DATED : March 2, 1993
INVENTOR(S) : Gregory N. Henderson, et al.

It is certified that error appears in the above—identified patent and that said Letters Patent is hereby corrected as shown below:

Column 17 (Page 21)

col. 17, line 13   "$m_1*$" should be "$m_I*$"
col. 17, line 13   "sin" should be "sin$\phi$"
col. 17, line 14   "$\phi$" should be deleted
                   (together with correction to line 28)

Column 18 (Page 21)

col. 18, line 6    ">" should be "<"
col. 18, line 16   "substanially" should be "substantial"

Signed and Sealed this

Eleventh Day of October, 1994

Attest:

BRUCE LEHMAN

Attesting Officer

Commissioner of Patents and Trademarks